United States Patent [19]

Becker

[11] 4,165,494
[45] Aug. 21, 1979

[54] BI-STATE LINEAR AMPLIFIER

[75] Inventor: Barry E. Becker, Smithtown, N.Y.

[73] Assignee: Circuit Technology Incorporated, Farmingdale, N.Y.

[21] Appl. No.: 900,967

[22] Filed: Apr. 28, 1978

[51] Int. Cl.² .............................................. H03F 3/18
[52] U.S. Cl. ..................................... 330/267; 330/51; 330/151; 330/262; 330/296
[58] Field of Search ................. 330/51, 151, 267, 296, 330/262; 307/239; 328/98

[56] References Cited

U.S. PATENT DOCUMENTS

| | | | |
|---|---|---|---|
| 3,514,637 | 5/1970 | Herrmann | 307/239 X |
| 3,562,656 | 2/1971 | Bateman | 330/151 X |
| 4,085,383 | 4/1978 | Palm et al. | 330/51 X |

*Primary Examiner*—Lawrence J. Dahl
*Attorney, Agent, or Firm*—Blum, Moscovitz, Friedman & Kaplan

[57] ABSTRACT

A bi-state linear amplifier is provided which, in response to a first state of a control signal, functions as a linear amplifier, and in response to a second state of a control signal, is cut off to define a high output impedance. The amplifier includes a control circuit responsive to relatively low-current control signals for selectively opening and closing the internal amplification circuit of the amplifier.

6 Claims, 1 Drawing Figure

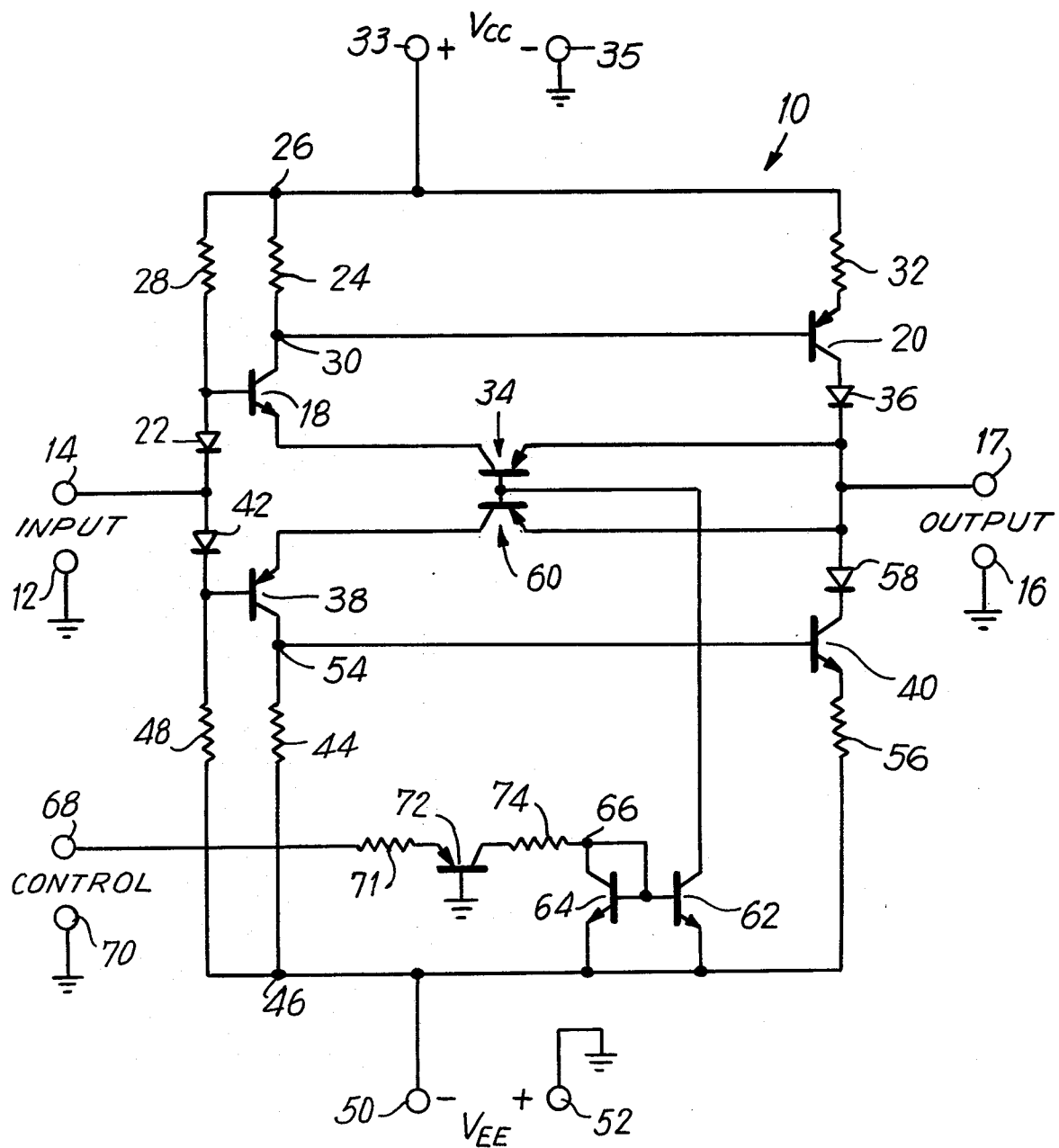

BI-STATE LINEAR AMPLIFIER

BACKGROUND OF THE INVENTION

This application relates generally to amplifiers particularly adapted for use in modern computer data bus systems. In such systems, a plurality of signals may be selectively applied to a single data bus through output amplifiers. It is desirable to apply such signals in sinusoidal or nearly sinusoidal form while avoiding spurious signals which contribute to noise. A substantial source of potential noise, and therefore a major problem in noise reduction and elimination of extraneous signals, are the high frequency components introduced into data bus lines by amplifiers not otherwise being driven.

In the art, data bus systems have utilized digital line drivers which, by their design, provide a high impedance when in an "off" state but such drivers cannot be utilized to drive sinusoidal signals, and therefore introduce undesirable frequency components on the data bus. On the other hand, where linear drivers capable of applying sinusoidal signals to a data bus line are utilized, high-current electronic switches must be added intermediate the amplifier output and the data bus to present the desired high output impedance. Such switches require relatively high power to drive, are relatively expensive and large, and further, consume system power since the entire amplifier current passes therethrough when in the "on" state.

By providing a linear amplifier including control means for selectively cutting off the internal operation of the amplifier in response to a low-current control signal, the foregoing disadvantages are avoided.

SUMMARY OF THE INVENTION

Generally speaking, in accordance with the invention, a bi-state linear amplifier is provided including amplifier circuit means for substantially linear amplification between an input and an output and including an amplifier circuit path, and control circuit means for selectively opening and closing said circuit path in response to a control signal whereby said amplifier circuit path is closed by said control circuit means in response to a first state of said control signal and is opened in response to a second state of said control signal, said amplifier presenting a high output impedance when its amplifier circuit path is opened.

Accordingly, an object of the invention is to provide a linear amplifier capable of being selectively cut off to present a high impedance output.

A further object of the invention is to provide a linear amplifier adapted for use with data bus systems whereby a relatively low current control signal may be utilized to selectively cut off the linear amplifier to present a high impedance to the data bus.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

The FIGURE is a circuit diagram of a bi-state linear amplifier in accordance with the invention.

DESCRIPTION OF THE PREFERRED EMBODIMENTS

Referring now to the figure, the linear amplifier circuit 10 depicted includes two complimentary feedback pairs of transistors connected for push-pull amplification of an input signal at terminals 12, connected to ground, and 14 connected to the amplifier circuit. The output of the amplifier is taken at terminals 16, connected to ground, and 17 connected to the amplifier circuit.

The first complimentary feedback pair of transistors is defined by NPN transistor 18 and PNP transistor 20. The base of transistor 18 is connected to the anode of diode 22, the cathode of that diode being connected to input terminal 14 for the application of the input signal to the base of transistor 18. The base of transistor 18 is connected through bias resistor 28 to junction 26. The collector of transistor 18 is connected through bias resistor 24 to junction 26. The base of PNP transistor 20 is connected to the junction 30 between resistor 24 and the collector of transistor 18. The emitter of transistor 20 is connected through a bias resistor 32 to junction 26, said junction also being connected to terminal 33 of voltage source $V_{CC}$, the negative terminal 35 of said voltage source being connected to ground. The amplifier circuit path of the first pair of transistors is completed by the connection between the emitter of transistor 18 and the collector of transistor 20 through the emitter-collector path of first control transistor 34 and output diode 36. Specifically, the emitter of transistor 18 is connected to the collector of first control transistor 34 (a PNP transistor). The emitter of first control transistor 34 is connected to the cathode of output diode 36, the anode of which is connected to the collector of transistor 20.

The second complimentary feedback pair of transistors is connected in a complimentary manner to the first pair but is otherwise identical. Thus, the second pair of transistors consist of a PNP transistor 38 and a NPN transistor 40. In this pair, the PNP transistor 38 has its base connected through diode 42 to input terminal 14, the base of transistor 38 being connected to the cathode of diode 42. The base of transistor 38 is connected through bias resistor 48 to junction 46. The collector of transistor 38 is connected through bias resistor 44 to junction 46. Junction 46 is connected to the negative terminal 50 of voltage source $V_{EE}$, the positive terminal 52 of which is connected to ground. NPN transistor 40 has its base connected to junction 54 between the collector of transistor 38 and bias resistor 44. The emitter of transistor 40 is connected through bias resistor 56 to junction 46. The collector of transistor 40 is connected to the cathode of output diode 58, the anode of which is connected to output terminal 17, said output terminal 17 also being connected to the cathode of output diode 36 of the amplification circuit of the first pair of transistors. The emitter-collector path of a second control transistor 60 is connected intermediate the emitter of transistor 38 and the anode of output diode 58.

The bases of first and second control transistors 34 and 60 are connected together and to the collector of third control transistor 62. Third control transistor 62 and fourth control transistor 64 are connected with their respective bases coupled together and with their respective emitters being connected to junction 46, said third and fourth control transistors being NPN-type transistors. The commonly-connected bases of third and fourth transistors 62 and 64 are coupled to a junction 66, to which is coupled the collector of fourth transistor 64. A control signal, of relatively low current, is applied to control terminals 68 and 70, terminal 70 being connected to ground. Control terminal 68 is coupled through resistor 71 to the emitter of fifth control transistor 72, the base of which is connected to ground. The collector of fifth control transistor 72 is connected through resistor 74 to junction 66.

When a high control signal is applied at control terminals 68 and 70, fifth control transistor 72 is turned on, causing equal currents to flow in third and fourth control transistors 62 and 64. The current in third transistor 62 is sufficient to maintain first and second control transistors 34 and 60 "on" for all output signal amplitudes within the linear range of the amplifier. Thus, when the control signal is in a "high" state, the respective amplification circuits are closed and transistors 18, 20, 38 and 40 and their associated circuitry function in a conventional push-pull amplification mode, preferably biased for Class AB operation. This circuit provides linear operation, high input impedance and low output impedance, all desired characteristics for use in connection with data bus systems when the circuit is functioning in its amplification mode.

However, when the control signal on terminals 68 and 70 is "low", fifth control transistor 72 is cut off, thereby cutting off fourth control transistor 64 which in turn cuts off third control transistor 62. With no current flowing in third control transistor 62, no current flows in first and second control transistors 60 and 34, which are in an "open" state.

Where first and second control transistors 34 and 60 are "open", no signals can pass through the amplifier and the output terminal 17 presents a high impedance. In this mode, the output terminal can withstand applied voltages from the data bus in excess of the supply voltage $V_{CC}$ and $V_{EE}$. The output diodes 36 and 58 prevent the collector-base junctions of transistors 20 and 40 from becoming forward biased in the "off" mode of the amplifier. Even with the supply voltages reduced to zero, the output terminal 17 can withstand applied voltages and continue to present a high output impedance. The only limitation would be presented by the semiconductor breakdown voltages.

By the foregoing arrangement, relatively low current control signals may be used to disconnect an amplifier from its load to the incorporation of relatively inexpensive components which draw relatively little power. Unlike the conventional output switch required to carry full load current, the control circuit of the bi-state linear amplifier in accordance with the invention carries tens to hundreds of times less current than the full load current, depending upon the $H_{FE}$ of the transistors used. For this reason, the bi-state linear amplifier in accordance with the invention finds particular application when coupled to data bus lines.

It will thus be seen that the objects set forth above, and those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A bi-state amplifier comprising an input; an output; amplifier circuit means connected between said input and output for substantially linear amplification and including at least one amplifier circuit path; means for selectively applying a control signal having at least first and second states; and control circuit means coupled to receive said control signal from said control signal means and coupled to said amplifier circuit means for maintaining closed said at least one amplifier circuit path when said control signal is in a first state and for opening said at least one amplifier circuit path when said control signal is in a second state, said amplifier circuit means being adapted to present a high output impedance when said at least one amplifier circuit path is opened and a low output impedance when said at least one amplifier circuit path is closed.

2. The bi-state linear amplifier as recited in claim 1, wherein the current of said control signal in said control circuit means is low as compared to the current at said output when said at least one amplifier circuit path is closed.

3. The bi-state linear amplifier as recited in claim 1, wherein said amplifier circuit means includes push-pull amplifier circuit means respectively having first and second amplifier circuit paths, said control circuit means including first and second switch means respectively positioned in said first and second amplifier paths for disposition in a "closed" state when said input signal is in its first state and for disposition in a "open" state when said input signal is in its second state.

4. The bi-state linear amplifier as recited in claim 3, wherein said push-pull circuit means includes a first pair of transistor means coupled in said first amplifier circuit path and a second pair of transistor means coupled in said second amplifier circuit path, a first transistor means of each pair of transistor means having its respective base coupled to said input, said first and second switch means including first and second control transistor means connected with their respective emitter-collector paths in series with the corresponding emitter-collector paths of said first transistor means of said first and second pairs of transistor means.

5. The bi-state linear amplifier as recited in claim 4, wherein said control circuit means further comprises third, fourth and fifth control transistor means and a voltage source, the respective bases of said first and second control transistor means being coupled in common and said common connection being coupled in series with the emitter-collector path of said third control transistor means and said supply voltage, the emitter-collector path of said fourth control transistor means being connected in series between a junction point and said voltage source, the emitter-collector path of said fourth transistor means being connected intermediate a junction and said voltage source, the respective bases of said third and fourth control transistor means being connected in common, the latter common connection being connected through said junction to the emitter-collector path of said fifth control transistor means, the emitter-collector path of said fifth transistor means being coupled to said control signal means.

6. The bi-state linear amplifier as recited in claim 4, including first and second diode means respectively positioned intermediate the emitter-collector path of the second transistor means of each of said first and second pairs of transistor means and said output.

* * * * *